(12) United States Patent
Anderson et al.

(10) Patent No.: US 9,059,319 B2
(45) Date of Patent: Jun. 16, 2015

(54) EMBEDDED DYNAMIC RANDOM ACCESS MEMORY DEVICE AND METHOD

(75) Inventors: Brent A. Anderson, Jericho, VT (US); John E. Barth, Jr., Williston, VT (US); Herbert L. Ho, New Windsor, NY (US); Edward J. Nowak, Essex Junction, VT (US); Wayne Trickle, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 682 days.

(21) Appl. No.: 12/692,760

(22) Filed: Jan. 25, 2010

(65) Prior Publication Data

US 2011/0180862 A1 Jul. 28, 2011

(51) Int. Cl.
*H01L 27/108* (2006.01)
*H01L 21/84* (2006.01)
*H01L 29/66* (2006.01)

(52) U.S. Cl.
CPC ............ *H01L 21/84* (2013.01); *H01L 27/1087* (2013.01); *H01L 27/10894* (2013.01); *H01L 29/66181* (2013.01)

(58) Field of Classification Search
CPC .................... H01L 27/10829; H01L 27/10861; H01L 27/10867
See application file for complete search history.

(56) References Cited

U.S. PATENT DOCUMENTS

| | | | |
|---|---|---|---|
| 5,627,092 A * | 5/1997 | Alsmeier et al. ............... 438/152 |
| 6,238,967 B1 | 5/2001 | Shiho et al. | |
| 6,281,054 B1 * | 8/2001 | Yeo ............................... 438/149 |
| 6,339,228 B1 | 1/2002 | Iyer et al. | |
| 6,410,399 B1 | 6/2002 | Flaitz et al. | |
| 6,426,252 B1 * | 7/2002 | Radens et al. ................ 438/243 |
| 6,434,041 B2 | 8/2002 | Forbes | |
| 6,555,891 B1 | 4/2003 | Furukawa et al. | |
| 6,590,259 B2 | 7/2003 | Adkisson et al. | |
| 6,670,675 B2 | 12/2003 | Ho et al. | |
| 6,737,316 B2 | 5/2004 | Lee | |
| 7,030,436 B2 | 4/2006 | Forbes | |
| 7,129,142 B2 * | 10/2006 | Wristers et al. ............... 438/305 |

(Continued)

OTHER PUBLICATIONS

Matsubara et al., "Fully Compatible Integration of High Density Embedded DRAM with 65nm CMOS Technology (CMOS5)", 2003, 4 pages, IEEE.

*Primary Examiner* — Benjamin Sandvik
(74) *Attorney, Agent, or Firm* — Anthony Canale; Hoffman Warnick LLC

(57) ABSTRACT

Embodiments of the invention provide an integrated circuit for an embedded dynamic random access memory (eDRAM), a semiconductor-on-insulator (SOI) wafer in which such an integrated circuit may be formed, and a method of forming an eDRAM in such an SOI wafer. One embodiment of the invention provides an integrated circuit for an embedded dynamic random access memory (eDRAM) comprising: a semiconductor-on-insulator (SOI) wafer including: an n-type substrate; an insulator layer atop the n-type substrate; and an active semiconductor layer atop the insulator layer; a plurality of deep trenches, each extending from a surface of the active semiconductor layer into the n-type substrate; a dielectric liner along a surface of each of the plurality of deep trenches; and an n-type conductor within each of the plurality of deep trenches, the dielectric liner separating the n-type conductor from the n-type substrate; wherein the n-type substrate, the dielectric liner, and the n-type conductor form a buried plate, a node dielectric, and a node plate, respectively, of a cell capacitor.

8 Claims, 5 Drawing Sheets

(56) References Cited

U.S. PATENT DOCUMENTS

| | | |
|---|---|---|
| 7,564,086 B2 | 7/2009 | Kwon et al. |
| 8,188,528 B2 * | 5/2012 | Pei et al. .................. 257/303 |
| 8,629,017 B2 * | 1/2014 | Pei et al. .................. 438/243 |
| 8,680,598 B2 * | 3/2014 | Cheng ...................... 257/301 |
| 2003/0082875 A1 | 5/2003 | Lee |
| 2006/0202249 A1 * | 9/2006 | Cheng et al. ............. 257/301 |
| 2008/0185646 A1 | 8/2008 | Anderson et al. |
| 2009/0079027 A1 * | 3/2009 | Cheng et al. ............. 257/522 |
| 2009/0173980 A1 * | 7/2009 | Cheng et al. ............. 257/301 |
| 2009/0176339 A1 | 7/2009 | Cheng et al. |
| 2011/0180862 A1 * | 7/2011 | Anderson et al. ......... 257/296 |

\* cited by examiner

US 9,059,319 B2

EMBEDDED DYNAMIC RANDOM ACCESS MEMORY DEVICE AND METHOD

TECHNICAL FIELD

Embodiments of the invention relate generally to integrated circuits and, more particularly, to embedded dynamic random access memory (eDRAM) devices having an n-type substrate and methods of forming such devices.

BACKGROUND OF THE INVENTION

Embedded dynamic random access memory (eDRAM) devices employ deep trench capacitors to store a charge. Such capacitors comprise a conductor, a node dielectric, and an n-band within a p-type substrate. Forming the n-bands requires out-diffusing a heavily n-doped material, such as a Arsenic-Doped Glass (ASG), from within the deep trench into the p-type substrate surrounding the deep trench. Typically, the heavily n-doped material is then removed and replaced with a dielectric, and a conductive material.

Forming capacitors in such a manner requires time-consuming and expensive process steps. eDRAM devices having capacitors not requiring formation by such process steps could therefore be produced more quickly and with less expense.

SUMMARY OF THE INVENTION

Embodiments of the invention provide an integrated circuit for an embedded dynamic random access memory (eDRAM), a semiconductor-on-insulator (SOI) wafer in which such an integrated circuit may be formed, and a method of forming an eDRAM in such an SOI wafer.

One aspect of the invention provides an integrated circuit for an embedded dynamic random access memory (eDRAM) comprising: a semiconductor-on-insulator (SOI) wafer including: an n-type substrate; an insulator layer atop the n-type substrate; and an active semiconductor layer atop the insulator layer; a plurality of deep trenches, each extending from a surface of the active semiconductor layer into the n-type substrate; a dielectric liner along a surface of each of the plurality of deep trenches; and an n-type conductor within each of the plurality of deep trenches, the dielectric liner separating the n-type conductor from the n-type substrate; wherein the n-type substrate, the dielectric liner, and the n-type conductor form a buried plate, a node dielectric, and a node plate, respectively, of a cell capacitor.

Another aspect of the invention provides a method of forming an embedded dynamic random access memory (eDRAM) in a semiconductor-on-insulator (SOI) wafer, the method comprising: forming an n-type substrate; depositing an insulator layer atop the n-type substrate; bonding an active semiconductor layer atop the insulator layer; forming a deep trench from a surface of the active semiconductor layer into the n-type substrate; depositing a dielectric liner within the deep trench; filling the deep trench with a conductor; and forming a transistor in the active semiconductor layer.

Yet another aspect of the invention provides a semiconductor structure comprising: an n-type substrate; an insulator layer atop the n-type substrate; an active semiconductor layer atop the insulator layer; and at least one deep trench extending from a surface of the active semiconductor layer into the n-type substrate.

The illustrative aspects of the present invention are designed to solve the problems herein described and other problems, not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
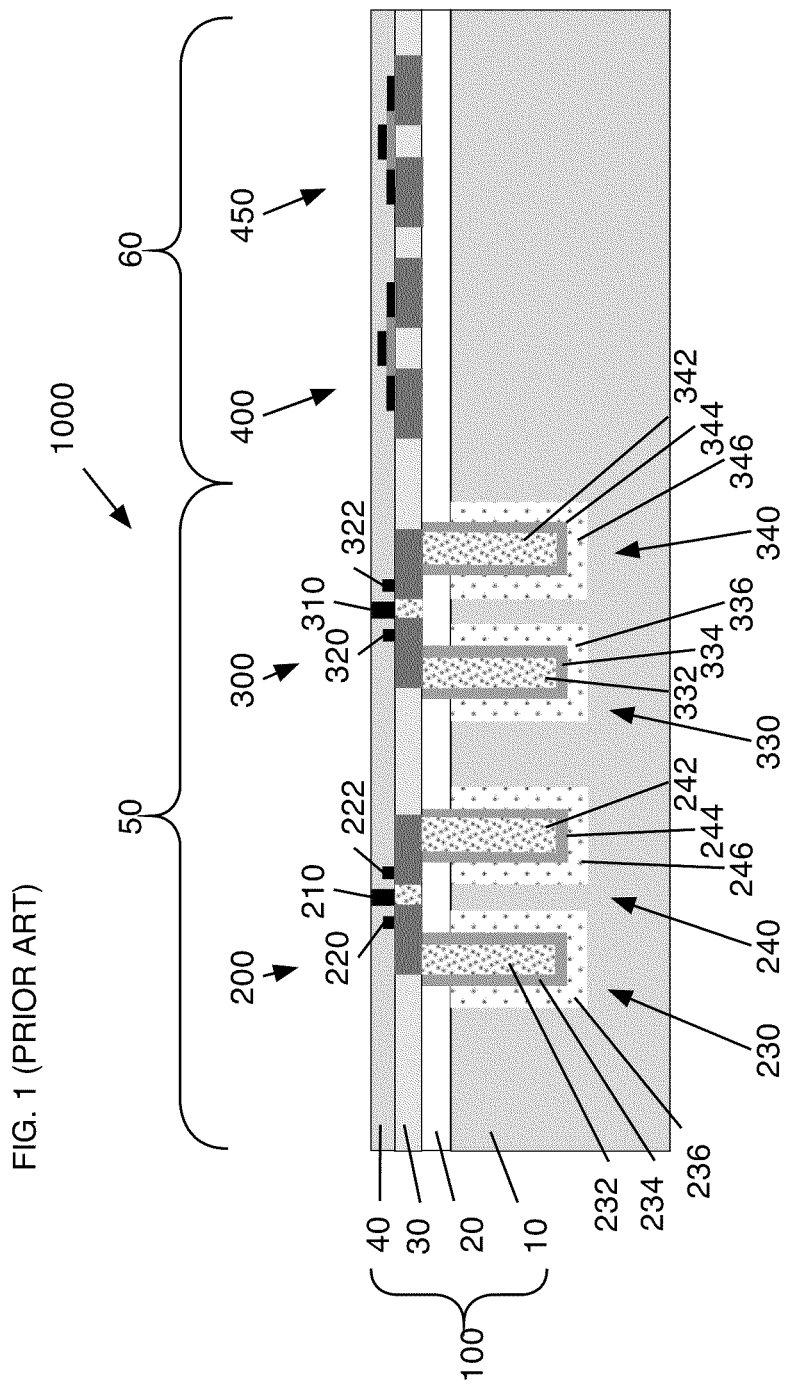
FIGS. 1-2 show side cross-sectional views of a known integrated circuit.

FIG. 1 shows a side cross-sectional view of a known integrated circuit 1000 comprising a semiconductor-on-insulator (SOI) wafer 100 into which may be formed an embedded dynamic random access memory (eDRAM) device. The SOI wafer 100 includes a p-type substrate 10, an insulator layer 20, an active semiconductor layer 30, and an interlayer dielectric (ILD) 40.

The materials of SOI wafer 100 may be those typically employed, although materials other than those enumerated below will be known to one skilled in the art and are within the scope of the present invention. For example, substrate 10 and/or active semiconductor layer 30 may include silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In some embodiments, substrate 10 and/or active semiconductor layer 30 may include amorphous or polycrystalline silicon. N-type dopants may include, for example, phosphorous, arsenic, antimony, sulphur, selenium, tin, silicon, and carbon.

Insulator layer 20 may include, for example, oxide, silicon oxide, silicon dioxide, silicon oxynitride, silicon nitride ($Si_3N_4$), tantalum oxides, alumina, hafnium oxide ($HfO_2$), hafnium silicate (HfSi), plasma-enhanced chemical vapor deposition oxide, tetraethylorthosilicate (TEOS), nitrogen oxides, nitrided oxides, aluminum oxides, zirconium oxide ($ZrO_2$), zirconium silicate ($ZrSiO_x$), high K (K>5) materials, and/or combinations thereof.

ILD 40 may include, for example, silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon-doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

SOI wafer 100 can be viewed as having a memory portion 50 and a logic portion 60. Memory portion 50 includes a plurality of deep trenches 230, 240, 330, 340, each lined with a dielectric liner 234, 244, 334, 344 and filled with an n-type conductor 232, 242, 332, 342, respectively.

Dielectric liners 234, 244, 334, 344 may include, for example, silicon oxide, silicon nitride, silicon oxynitride, a high-k material having a relative permittivity above about 10, or any combination of these materials. Examples of high-k materials include, but are not limited to, metal oxides such as $Ta_2O_5$, $BaTiO_3$, $HfO_2$, $ZrO_2$, $Al_2O_3$, or metal silicates such as $HfSi_xO_y$, or $HfSi_xO_yN_z$, where x, y, and z represent relative proportions, each greater than or equal to zero and x+y+z=1 (1 being the total relative mole quantity).

N-type conductors 232, 242, 332, 342 may include, for example, arsenic or phosphorus-doped amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. In some embodiments, the system comprising high-k dielectric, together with the conductor result in an effective work-function value approximately equal to the conduction-band energy of the silicon.

Dielectric liners 234, 244, 334, 344 and n-type conductors 232, 242, 332, 342 may be formed, for example, by oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition.

Typically, each deep trench 230, 240, 330, 340 is first filled with a heavily n-doped "dummy" polysilicon in order to form out-diffused n-bands 236, 246, 336, 346. The "dummy" polysilicon is then removed and each deep trench 230, 240, 330, 340 refilled with, for example, an n-doped polysilicon.

Within memory portion 50, active semiconductor layer 30 includes transistors 200, 300 (e.g., nFETs) above the deep trenches 230, 240, 330, 340. Each transistor 200, 300, includes a plurality of polysilicon conductors 220, 320, 210, 310, 222, 322. Polysilicon conductors 222, 232 function as gate conductors of transistors 200, 300, respectively, and also as word lines of the eDRAM device. Conductors 210, 310 function as gates of transistors 200, 300, respectively, and also as bit line contacts of the eDRAM device. Within logic portion 60, active semiconductor layer 30 may include one or more nFET 400 or pFET 450.

Figure 2:
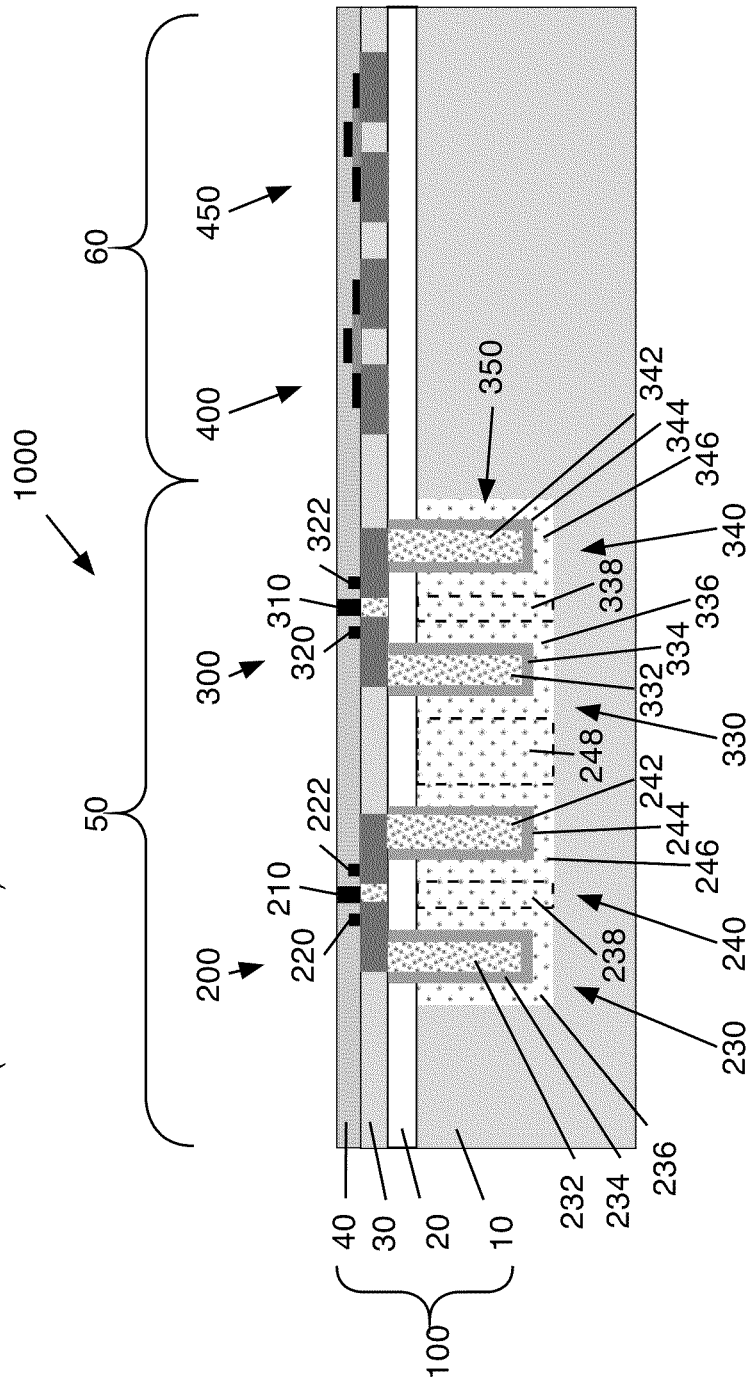

In FIG. 2, it can be seen that the out-diffused n-bands 236, 246, 336, 346 have joined at regions 238, 248, 338 to form a continuous plate 350. Thus, each deep trench 230, 240, 330, 340 forms a capacitor having a node plate (i.e., n-type conductor 232, 242, 332, 342), a node dielectric (i.e., dielectric liner 234, 244, 334, 344), and a buried plate (i.e., plate 350).

As noted above, however, formation of plate 350 from out-diffused n-bands 236, 246, 336, 346 requires a number of process steps and, as a consequence, results in increased production costs.

Figure 3:
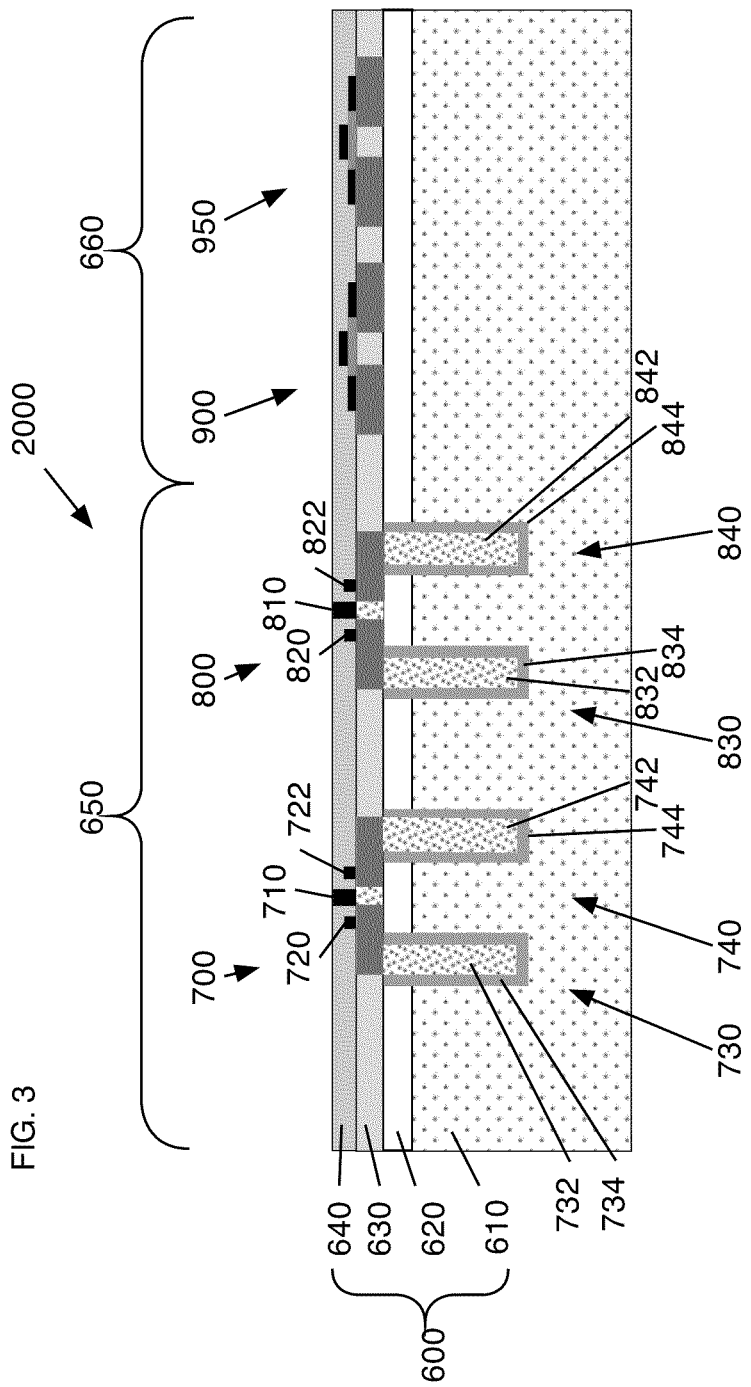
FIGS. 3-4 show side cross-sectional views of integrated circuits according to embodiments of the invention.

FIG. 3 shows an integrated circuit 2000 for an eDRAM device according to an embodiment of the invention. Here, an n-type substrate 610 is used, rather than a p-type substrate as in FIGS. 1 and 2. As a consequence, each deep trench 730, 740, 830, 840 forms a capacitor having a node plate (i.e., n-doped conductors 732, 742, 832, 842), a node dielectric (i.e., dielectric liners 734, 744, 834, 844), and a buried plate (i.e., n-type substrate 610). Thus, the steps required for forming out-diffused n-bands 236, 246, 336, 346 (FIGS. 1-2) and plate 350 (FIG. 2) are avoided and production costs are reduced, as compared to known integrated circuits, such as that shown in FIGS. 1 and 2.

Employing n-type substrate 610 rather than a p-type substrate with an out-diffused n-band plate 350 (FIG. 2) may result in a performance degradation, typically of about 2%, with a corresponding increase in active power. Such a penalty may be worthwhile, given the significant reduction in production costs. However, the penalty may be avoided by, for example, introducing a p-type dopant beneath the FETs 900, 950 of logic section 660.

Figure 4:
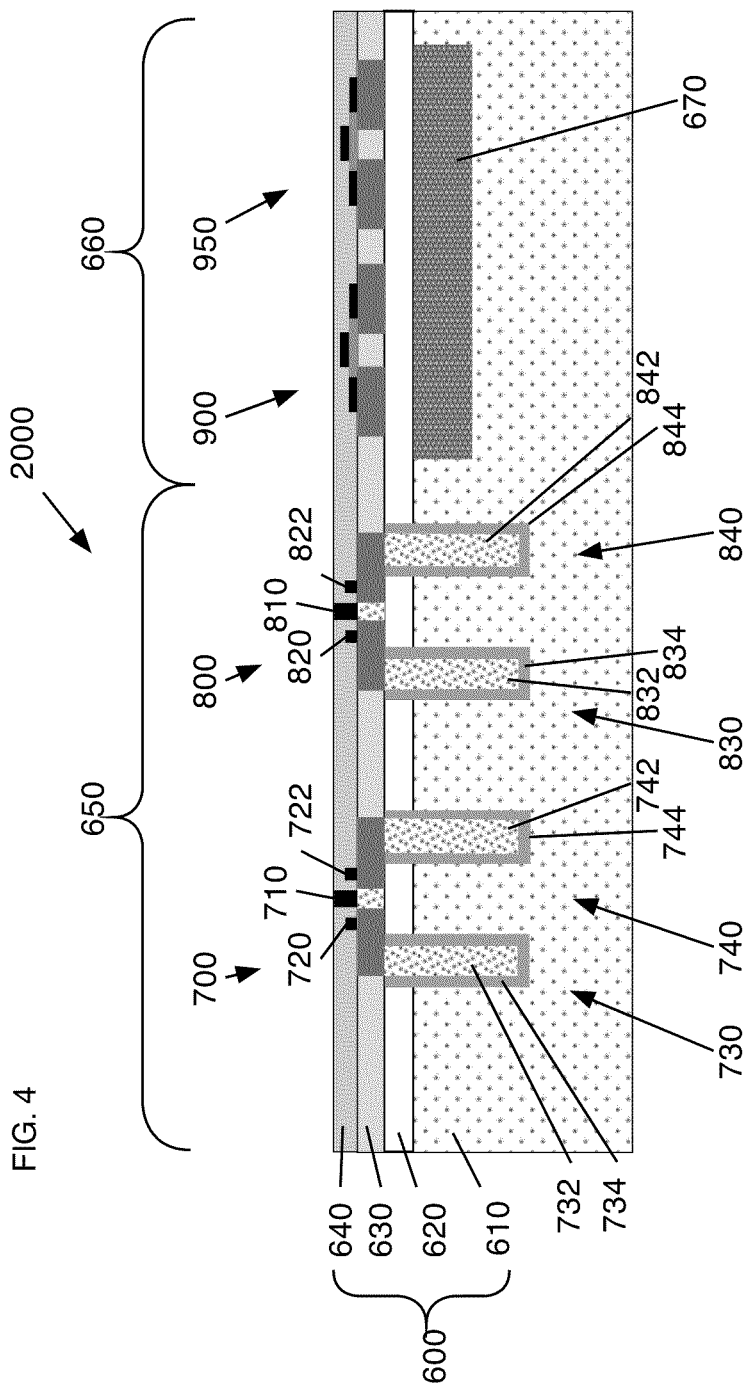

Such an embodiment is shown in FIG. 4. A p-doped region 670 is formed in n-type substrate 610 immediately beneath insulator layer 620 within logic portion 660. Suitable p-type dopants include, but are not limited to, boron, indium, and gallium. Such an arrangement permits active semiconductor layer 630 beneath FETs 900, 950 to deplete by a few hundred nanometers, or greater, at use voltages and thereby avoid the performance penalty noted above.

While shown as including FETs 900, 950, logic portion 660 may include any non-memory component. For example, logic portion 660 may include a resistor, an inductor, a diode, or a capacitor.

Figure 5:
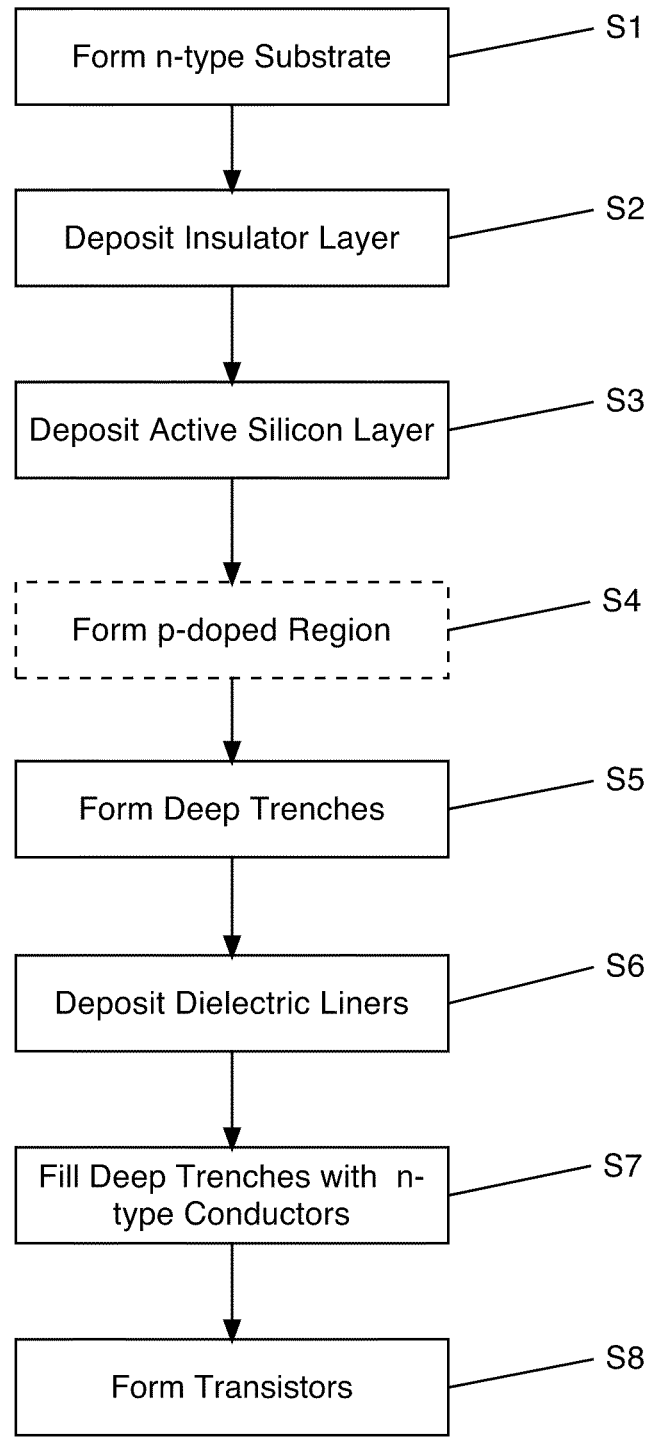
FIG. 5 shows a flow diagram of a method according to an embodiment of the invention.

FIG. 5 shows a flow diagram of a method according to an embodiment of the invention. At S1, an n-type substrate 610 (FIG. 4) is formed, e.g., grown from a silicon seed, cut and polished. At S2, an insulator layer 620 is deposited atop n-type substrate 610, and at S3 an active semiconductor layer 630 is deposited atop insulator layer 620, for example, by means of wafer bonding and thinning, or cutting. At S4, a p-doped region is optionally formed by, for example, introducing a masked ion implant of p-type dopant, such as boron, at sufficient energy to deposit the majority of ions in the n-type substrate 610, just below the insulator layer 620. A typical energy for B11 ion implantation would be between about 60 keV and about 100 keV.

At S5, deep trenches (e.g., 230) are formed from active semiconductor layer 630 into n-type substrate 610 in any now-known or later-developed manner. Deep trenches 230 are lined with dielectric liners (e.g., 234) at S6 and filled with n-type conductors 232 at S7. Finally, at S8, transistors 700, 800 and 900, 950 may be formed in active semiconductor layer 630 of memory portion 650 and logic portion 660, respectively.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An integrated circuit for an embedded dynamic random access memory (eDRAM) comprising:
   a semiconductor-on-insulator (SOI) wafer including:
      an n-type substrate;
      an insulator layer atop the n-type substrate; and
      an active semiconductor layer atop the insulator layer;
   a memory section comprising:
      a plurality of deep trenches, each extending from a surface of the active semiconductor layer adjacent the insulator layer into the n-type substrate;
      a dielectric liner along a surface of each of the plurality of deep trenches; and
      an n-type conductor within each of the plurality of deep trenches and extending to the active semiconductor layer, the dielectric liner separating the n-type conductor from the n-type substrate and the insulator layer,
      wherein the n-type substrate, the dielectric liner, and the n-type conductor form a buried plate, a node dielectric, and a node plate, respectively, of a cell capacitor; and
   a logic section adjacent the memory section, the logic section comprising:
      at least one component within the active semiconductor layer and above both the insulator layer and the n-type substrate, the at least one component selected from a group consisting of an nFET, a pFET, a resistor, an inductor, a diode, and a capacitor.

2. The integrated circuit of claim 1, wherein each of the n-type substrate and the active semiconductor layer is selected from a group consisting of: silicon, germanium, silicon germanium, and silicon carbide.

3. The integrated circuit of claim 2, wherein the n-type substrate includes at least one dopant selected from a group consisting of: phosphorous, arsenic, antimony, sulphur, selenium, tin, silicon, and carbon.

4. The integrated circuit of claim 1, wherein the logic section further comprises:
   a p-doped region within the n-type substrate and beneath the at least one component, the p-doped region including at least one p-type dopant selected from a group consisting of: boron, indium, and gallium.

5. The integrated circuit of claim 1, wherein the at least one component includes an nFET.

6. The integrated circuit of claim 1, wherein the at least one component includes a pFET.

7. A semiconductor structure comprising:
   an n-type substrate;
   an insulator layer atop the n-type substrate;
   an active semiconductor layer atop the insulator layer;
   at least one deep trench extending from a surface of the active semiconductor layer adjacent the insulator layer into the n-type substrate, the at least one deep trench including an n-type conductor extending to the active semiconductor layer and a dielectric liner along a surface of the at least one deep trench and separating the n-type conductor from the n-type substrate and the insulator layer; and
   a p-doped region laterally disposed with respect to the at least one deep trench within the n-type substrate.

8. The semiconductor structure of claim 7, wherein:
   the n-type substrate includes at least one dopant selected from a group consisting of: phosphorous, arsenic, antimony, sulphur, selenium, tin, silicon, and carbon; and
   the p-doped region includes at least one p-type dopant selected from a group consisting of: boron, indium, and gallium.

* * * * *